(12) United States Patent
Plofsky et al.

(10) Patent No.: US 8,661,396 B1
(45) Date of Patent: Feb. 25, 2014

(54) DSP DESIGN SYSTEM LEVEL POWER ESTIMATION

(71) Applicant: Altera Corporation, San Jose, CA (US)

(72) Inventors: Jordan Plofsky, Sunnyvale, CA (US); Philippe Molson, San Jose, CA (US); Francois Pequillat, Issy les Moulineaux (FR)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/838,969

(22) Filed: Mar. 15, 2013

Related U.S. Application Data

(63) Continuation of application No. 13/009,467, filed on Jan. 19, 2011, now Pat. No. 8,402,419, which is a continuation of application No. 11/600,436, filed on Nov. 15, 2006, now Pat. No. 7,882,457, which is a continuation of application No. 10/866,391, filed on Jun. 10, 2004, now Pat. No. 7,143,368.

(51) Int. Cl.
*G06F 17/50* (2006.01)
(52) U.S. Cl.
USPC ............................ 716/132; 716/111; 716/136
(58) Field of Classification Search
USPC ......................................... 716/111, 132, 136
See application file for complete search history.

(56) References Cited

U.S. PATENT DOCUMENTS

| | | | |
|---|---|---|---|
| 6,080,204 A | 6/2000 | Mendel | |
| 6,671,857 B1 | 12/2003 | Motohara et al. | |
| 6,901,565 B2 * | 5/2005 | Sokolov | 716/109 |
| 6,968,514 B2 | 11/2005 | Cooke | |
| 6,986,069 B2 | 1/2006 | Oehler et al. | |
| 7,003,738 B2 | 2/2006 | Bhattacharya et al. | |
| 7,143,368 B1 | 11/2006 | Plofsky et al. | |
| 7,882,457 B1 | 2/2011 | Plofsky et al. | |
| 2005/0204316 A1 | 9/2005 | Nebel et al. | |

OTHER PUBLICATIONS

U.S. Office Action dated Apr. 17, 2006 in U.S. Appl. No. 10/866,391.
U.S. Notice of Allowance dated Jul. 20, 2006 in U.S. Appl. No. 10/866,391.
U.S. Office Action dated Mar. 11, 2009 in U.S. Appl. No. 11/600,436.
U.S. Final Office Action dated Aug. 3, 2009 in U.S. Appl. No. 11/600,436.
U.S. Office Action dated Apr. 26, 2010 in U.S. Appl. No. 11/600,436.
U.S. Notice of Allowance dated Sep. 20, 2010 in U.S. Appl. No. 11/600,436.
U.S. Office Action dated Apr. 19, 2012 in U.S. Appl. No. 13/009,467.
U.S. Notice of Allowance dated Nov. 15, 2012 in U.S. Appl. No. 13/009,467.

* cited by examiner

*Primary Examiner* — Thuan Do
(74) *Attorney, Agent, or Firm* — Weaver Austin Villeneuve & Sampson LLP

(57) ABSTRACT

Power consumption estimation is performed at the system level in a design process, thus allowing early evaluation of feasibility and other considerations relating to logic/DSP design and hardware implementation of a proposed electronic design. Evaluation of the system level power consumption estimate(s) permits adjustment of a system level representation of the proposed electronic design, prior to investment of substantial resources in the electronic design. Other estimates, including other power consumption estimates, may be performed to adjust the proposed electronic design as well. Such estimates may be made in response to gate level power consumption estimates and/or hardware level power consumption estimates.

20 Claims, 5 Drawing Sheets

DSP DESIGN SYSTEM LEVEL POWER ESTIMATION

CROSS-REFERENCE TO RELATED APPLICATIONS

This application is a continuation and claims priority and benefit, under 35 U.S.C. §120, of co-pending U.S. patent application Ser. No. 13/009,467, filed Jan. 19, 2011, and entitled "DSP DESIGN SYSTEM LEVEL POWER ESTIMATION", which is hereby incorporated by reference in its entirety.

The U.S. patent application Ser. No. 13/009,467 is a continuation and claims priority and benefit, under 35 U.S.C. §120, of U.S. patent application Ser. No. 11/600,436, filed Nov. 15, 2006, and issued Feb. 1, 2011 as U.S. Pat. No. 7,882,457 and entitled "DSP DESIGN SYSTEM LEVEL POWER ESTIMATION", which is hereby incorporated by reference in its entirety.

The U.S. patent application Ser. No. 11/600,436 is a continuation and claims priority and benefit, under 35 U.S.C. §120, of U.S. patent application Ser. No. 10/866,391, issued as U.S. Pat. No. 7,143,368, filed Jun. 10, 2004, and entitled "DSP DESIGN SYSTEM LEVEL POWER ESTIMATION", which is hereby incorporated by reference in its entirety.

FIELD OF THE INVENTION

The DSP Design System Level Power Estimation systems and techniques relate generally to designing systems for digital signal processing and the like. The systems and techniques further relate to estimating power consumption of a proposed electronic design based on a system level representation of the proposed electronic design early in the design process. The systems and techniques can be used in connection with programmable or otherwise configurable devices, including programmable logic devices.

DESCRIPTION OF RELATED ART

Electronic design automation (EDA) includes computer-based tools and/or processes that provide designers with automated tools for designing and verifying a user's custom circuit designs, such as integrated circuit or printed circuit board designs. EDA is used for creating, analyzing and editing a proposed electronic design for purposes of simulation, prototyping, execution and/or computing. EDA technology can also be used to develop systems that will use one or more user-designed subsystems and/or components. The end result of EDA is often a modified and enhanced design that is an improvement over the original design.

System design involves the creation, development and refining of electronic designs such as channels and other structures for implementation in electronic devices such as programmable logic devices (PLDs) and other programmable devices. System characteristics such as noise immunity, error recovery, etc. are evaluated using simulation and complex mathematical analysis software. However, later stages of the process require time and resource commitments that can be substantial. In response to this, some earlier design processes have provided designers with the ability to obtain information concerning area and speed of a proposed design.

However, current design flows for DSP intensive algorithms require near completion of the design flow prior to estimating power consumption of a proposed design. Understanding a design's static and dynamic power usage is critical to appropriate implementation of the design. This includes situations in which the design will be implemented in a programmable device, such as a programmable logic device (or PLD).

For example, in designing a filter for implementation in a programmable device, noise immunity characteristics and other information are needed by a designer, who has a choice of filters that vary as to depth and architecture and that have different costs, area usage implications, power consumption implications, etc. associated with the filter's performance. Using current design techniques, designers only optimize the filter relative to a performance vector. However, in the end, the designer may find that the filter cannot be implemented due to a system characteristic that the designer did not have at the system level phase of the filter's design. Because each alternative design goes through a complete design cycle (including development for and implementation and testing in hardware), the time and resources required for thorough consideration of all options can be prohibitive. The unavailability of system characteristic information thus restricts the different design strategies that can be explored, including, in the filter example, non-filter possibilities (such as forward error correction). Another example of a design situation in which options are limited is the evaluation of channel strategies for multi-channel implementations (such as whether to use parallel processing structures or time-division multiplexing or a hybrid of both).

The design process can be broken down into several domains (or phases), including a system level design domain/phase, a logic/DSP design domain/phase, a hardware level design domain/phase and a software level design domain/phase. In the system level phase, involving design entry and analysis, tools such as Simulink (an interactive environment for modeling, simulating and prototyping dynamic systems) and Matlab (an algorithm compiler), both of which are available from Mathworks, Inc. of Natick, Mass., and DSP Builder, from Altera Corporation of San Jose, Calif., can be used. Altera's DSP Builder integrates both high-level algorithm and hardware description language (HDL) development tools by combining the algorithm development, simulation, and verification capabilities of Matlab and Simulink system-level design tools with VHDL synthesis, simulation and Altera development tools. A designer using DSP Builder, which is based on Simulink, typically works from a Simulink representation to a VHDL representation to a bitstream representation. An algorithm usually is designed using hardware information such as bit-width and available hardware resources (for example, a pre-existing DSP block in the target hardware, other pre-set modules and functions, the presence of phase lock loop circuitry, the presence of embedded memory blocks, the structure and layout of logic elements, etc.).

Hardware testing can include downloading the design into the hardware platform and measuring the power consumption in the hardware. The system level design is compiled and evaluated in the logic/DSP and hardware design domains, including (for example) the following steps:

Translation to an RTL representation (for example, using SignalCompiler from Altera);

RTL analysis and synthesis (for example, using Quartus II from Altera—this step returns the estimated device area used by the design);

Fitting (again, for example, using Quartus II), which is typically the most time consuming step;

Timing analysis (again, for example, using Quartus II), which returns all the worst case timing information of the design; and Power analysis (again, for example, using Quartus II), which returns estimated power consumption.

If the estimated power consumption of a system design is over a required maximum value (or otherwise fails to meet some power constraint or requirement), designers go back to the system level design domain.

Thus, when considering an algorithm developed as a proposed electronic design, designers have been able to include system level tool analysis hardware information such as datapath bit width and clock domain availability. Consideration of this hardware information in a system level tool has been critical in reducing the development cycle of a design under consideration. Unfortunately, as noted above, not all hardware implementation information has been available in system level tools. Power consumption requirements can drastically change the shape and nature of an algorithm (for example, by affecting decisions as to hardware-software co-partitioning, time division multiplexing, parallelism or oversampling to determine optimal bandwidth frequency). However, tools for power consumption evaluation in DSP systems have only been available well into the hardware design phase. Currently, system level DSP algorithm developers have no tools that can help them estimate the static and dynamic power consumption of a proposed design under development prior to near completion of the entire design process.

As an example, one power consumption estimation development tool is the Power Gage tool used in connection with Altera's Quartus II design software. Power Gage provides power consumption information to a designer after a gate level representation of a system has been developed, usually in the logic/DSP design phase of the design process. FIG. 1 is a flow and schematic illustration of a prior art process similar to the Power Gage tool used in developing a digital signal processing (DSP) device or design in chronological sequence (time is denoted by the arrow at the bottom of FIG. 1). Typically, at least two different individuals or groups of people work on a design. First, one or more system designers are responsible for creating a system level design conceptually and in a written specification. Logic/DSP designers, a different group of individuals, then develop one or more hardware implementations of the design, using appropriate hardware (for example, a PLD).

As seen in FIG. 1, in the system level phase of development at 110, an algorithmic representation of a design is developed at 112. This algorithm representation may be a flow diagram or other similar graphical and/or conceptual representation of the functionality or functionalities of the intended design. In this prior design process, a system level design based on the algorithmic representation is then created at 114. System level designers typically use C++, M and Simulink languages for their designs (though they may occasionally use VHDL and/or Verilog for system partitioning). Finally, a specification is written at 118. This ends the system level design phase of the process.

At this point, the logic/DSP design phase 120 begins. A written code representation of the design is generated at 122 (for example, an RTL code). Thereafter, a code simulation can be run at 123, followed by logic synthesis at 124, gate level simulation at 125 and place and route evaluation at 126. Throughout these steps, testing may be done. Finally, when these prior steps of the logic/DSP design phase are completed, a power estimation is done at 128.

The hardware design phase 130 of the process commences at approximately the same time as the logic/DSP phase 120. Initially, schematics are developed at 132, followed by development of a board layout at 134 and board manufacturing or creation at 136. The hardware designers typically use VHDL and Verilog languages for their designs.

The software design phase 140 can begin at about the same time as the development of the board layout. This software design phase 140 can include software development and debugging at 142 followed by software integration at 144.

Various readings and estimates can be taken and made during this prior process. As seen in FIG. 1, a first area estimation can be performed after the place and route evaluation at 126. In addition, a first power estimate is made at 128. These estimates can be provided to a decision maker 155 to determine whether the estimated power consumption is too high and/or whether the estimated area usage is too high. If neither is too high, no changes to the system are required at 156. This is highly unusual with a first or early version of a proposed design. When either or both of the estimates is too high, changes is made to the proposed design at 157. As seen in FIG. 1, the decision maker 155 also may take into account power levels measured after the board manufacture step at 136 in the hardware design phase 130. The changes to the proposed design can include going back to the algorithm development step at 112 and the written specification at 118 in the system level design phase 110. Moreover, changes may be made to the proposed schematics at 132.

As will be appreciated by those skilled in the art, revisiting algorithm development, specification writing and schematic design steps in this process represents a costly and time consuming step backward in the design process, as well as a sacrifice of resources expended in getting to this point. Substantial time, money and other resources likely have been invested in getting to the point where power and area estimates and measured power levels can be used to determine the feasibility and/or desirability of a proposed design.

BRIEF SUMMARY OF THE INVENTION

Systems, methods, products and techniques that permit system level power consumption estimation for use in DSP design would allow early, system level estimation so that different ideas can be compared to power consumption requirements and considerations, thus saving time and effort that would otherwise go into undesirable or unworkable algorithms and/or designs, would represent a significant advancement in the art. Moreover, providing designers with information and requirements to estimate needs and/or costs at the system level phase of electronic design will provide those designers with better estimation tools to reduce design time and cost and would likewise constitute a significant advancement in the art.

DSP Design System Level Power Estimation systems and techniques provide for early evaluation of power consumption of a proposed electronic design. These techniques can be implemented in computers used in the design of programmable devices such as PLDs and similar devices. Moreover, the systems and techniques include computer program products that can program such computers to implement such techniques.

Power consumption estimation is performed at the system level in a design process, thus allowing early evaluation of feasibility and other considerations relating to logic/DSP design and hardware implementation of a proposed electronic design. Evaluation of the system level power consumption estimate(s) permits adjustment of a system level representation of the proposed electronic design, prior to investment of substantial resources in the electronic design. Other estimates, including other power consumption estimates, may be performed to adjust the proposed electronic design as well.

Such estimates may be made in response to gate level power consumption estimates and/or hardware level power consumption estimates.

One or more system level representations of a proposed electronic design can be generated and evaluated to produce system level power consumption estimates. If the estimated power consumption of a proposed electronic design is outside power consumption requirements, adjustments can be made to the system level representation of the electronic design to save resources in the design process. Later estimates may be performed on gate level representations and/or hardware level representations to further adjust the proposed electronic design's power consumption attributes.

Estimating power consumption may include consulting one or more library information sources. These library information sources may be adaptive, intelligent libraries with information about components used in electronic designs as well as information concerning interactions between and among these various components and their effects on power consumption.

Further details and advantages of the DSP Design System Level Power Estimation systems and techniques are provided in the following Detailed Description and the associated Figures.

BRIEF DESCRIPTION OF THE DRAWINGS

The DSP Design System Level Power Estimation systems and techniques will be readily understood by the following detailed description in conjunction with the accompanying drawings, wherein like reference numerals designate like structural elements, and in which.

DETAILED DESCRIPTION OF SEVERAL EMBODIMENTS OF THE INVENTION

Figure 1:
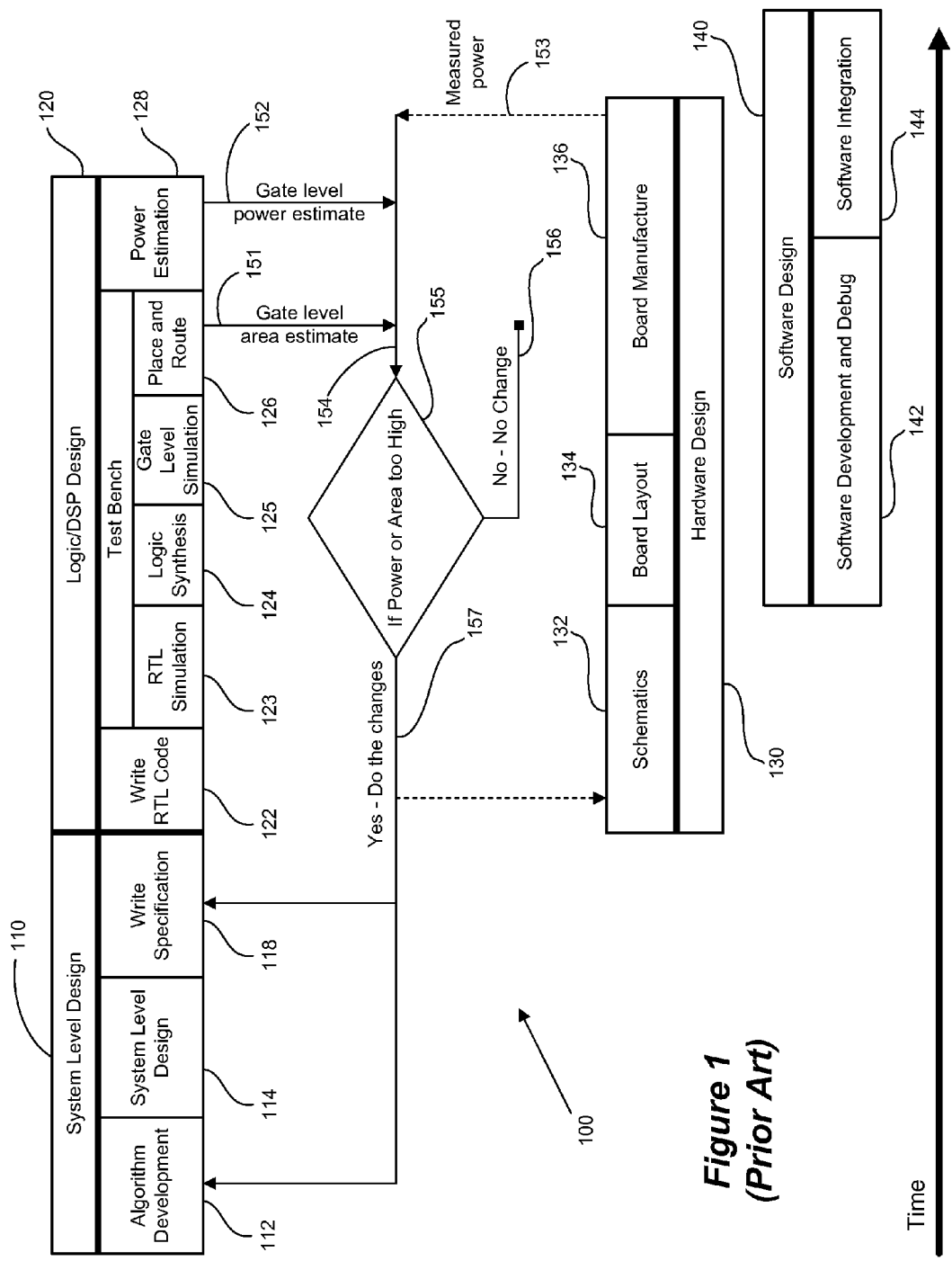
FIG. 1 is a flow and schematic diagram of a prior art design process.

The following detailed description of the DSP Design System Level Power Estimation systems and techniques will refer to one or more embodiments of the systems and techniques, but is not limited to such embodiments. The detailed description is intended only to be illustrative. Those skilled in the art will readily appreciate that the detailed description given herein with respect to the Figures is provided for explanatory purposes as the invention extends beyond these limited embodiments.

Embodiments of the systems and techniques will be explained in connection with various devices, tools, etc. herein. However, these references are for purposes of illustration only and are not intended to limit the systems and techniques in any way. For example, one or more embodiments of the systems and techniques will be explained using Altera's DSP Builder hardware system level design tool to illustrate the systems and techniques. However, the systems and techniques are widely applicable to other builder and/or design tools, for example those used in creating high-performance system-on-a-programmable-chip (SOPC) and other designs, and may be used with a wide variety of IP blocks and other components, as will be appreciated by those skilled in the art. For example, embodiments of the systems and techniques can be incorporated into Altera's NIOS® embedded processor, which is a user-configurable, general-purpose RISC embedded processor. Such embedded designers can create custom processor-based systems very easily using Altera's SOPC Builder system development tool. SOPC Builder can be used to integrate one or more configurable NIOS® CPUs with any number of standard peripherals, gluing the system together with an automatically generated Avalon™ switch fabric.

The systems and techniques use early evaluation of power consumption information in the design process (for example, using one or more approximations of components in a proposed electronic design) to assist designers in weeding out algorithms and/or designs that are not feasible from a hardware implementation standpoint, in permitting a more thorough consideration of system options and alternatives and in saving time, money and resources in refining systems by avoiding major changes to power consumption attributes of a system later in the design process (for example, in the logic/DSP and/or hardware design phases of the process). The systems and techniques provide system level designers (typically not the same people responsible for the logic/DSP, hardware and software design phases) with early information regarding various environmental challenges, such as power consumption, area usage and other costs associated with implementation of an electronic design in a given device, such as a PLD. In some embodiments of the systems and techniques, power consumption, area usage, speed and/or other information is combined to generate a combined estimate that delineates permissible operational characteristics of an algorithm being developed. Such combinations of this system information also may be used to evaluate trade offs (for example, between power consumption and area usage) in the system level phase of the design process.

The systems and techniques address various issues and shortcoming of earlier processes. The systems and techniques abbreviate the initial iterations of a design by shortening the critical path in the design process. The critical path for design in earlier systems required going all the way to the hardware domain before power estimation was performed. The systems and techniques allow one or more initial iterations of a design to be performed in the system level domain, thus shortening the critical path.

Moreover, the systems and techniques allow one or more iterations of a design and early power estimations to be performed by the same individual(s) doing the system level design work, again a benefit not available from earlier systems that required distinct groups of designers to work interactively. Typically the system level designer is not the hardware designer and, from a practical standpoint, it is not always possible to run iterations between these two groups of designers. Therefore, a final electronic design might end up using an algorithm that is not optimized for power. Thus, at this point, power consumption system adjustments can only be made in the hardware domain (for example, by removing a product feature or by modifying a fan, power supply, device selection, etc.), which frequently increases the price of the final product.

Another benefit to use of embodiments of the systems and techniques is that a broader scope of potential designs may be considered by system level designers early in the design process. Because evaluations can be conducted at a much higher level, typically using fewer blocks or other modules in system designs and algorithms, more variations on and alternatives to a given design can be considered prior to committing time and resources to more detailed evaluation of one or more of the designs under consideration. This means that system level designers are able to efficiently review many more possible implementations of a design and provide other designers farther "down" the process with more realistic ranges of possible designs.

Finally, the systems and techniques allow designers to identify critical blocks in designs from a power consumption standpoint very early on in the design process. In the hardware domain, it may be difficult to pinpoint which subsystem is a substantial source of a power drain. Working in the system level domain and considering alternative algorithms at this level using the systems and techniques permits consideration of options and potential design problems early in the design process.

Algorithm-based and other system level power consumption estimates according to the systems and techniques are based on a system level representation of a proposed electronic design, the components of the design, and the interaction of those components in the system represented. A "system level representation" is a representation of a proposed electronic design in the system level phase of the design process (for example, algorithmic representations and system level design representations). By estimating power (possibly in connection with other considerations such as area and cost) early in the design process (the system level design phase of the process), extensive investment of time and other resources in unfeasible and/or otherwise undesirable designs during the design process can be avoided.

One or more computer program products comprising a machine readable medium on which is provided program instructions for performing an embodiment of the systems and techniques also are disclosed. Such computer program products may be used in connection with the design of applications for hardware such as programmable devices like PLDs. Moreover, methods for performing various embodiments of the systems and techniques also are disclosed.

Figure 2:
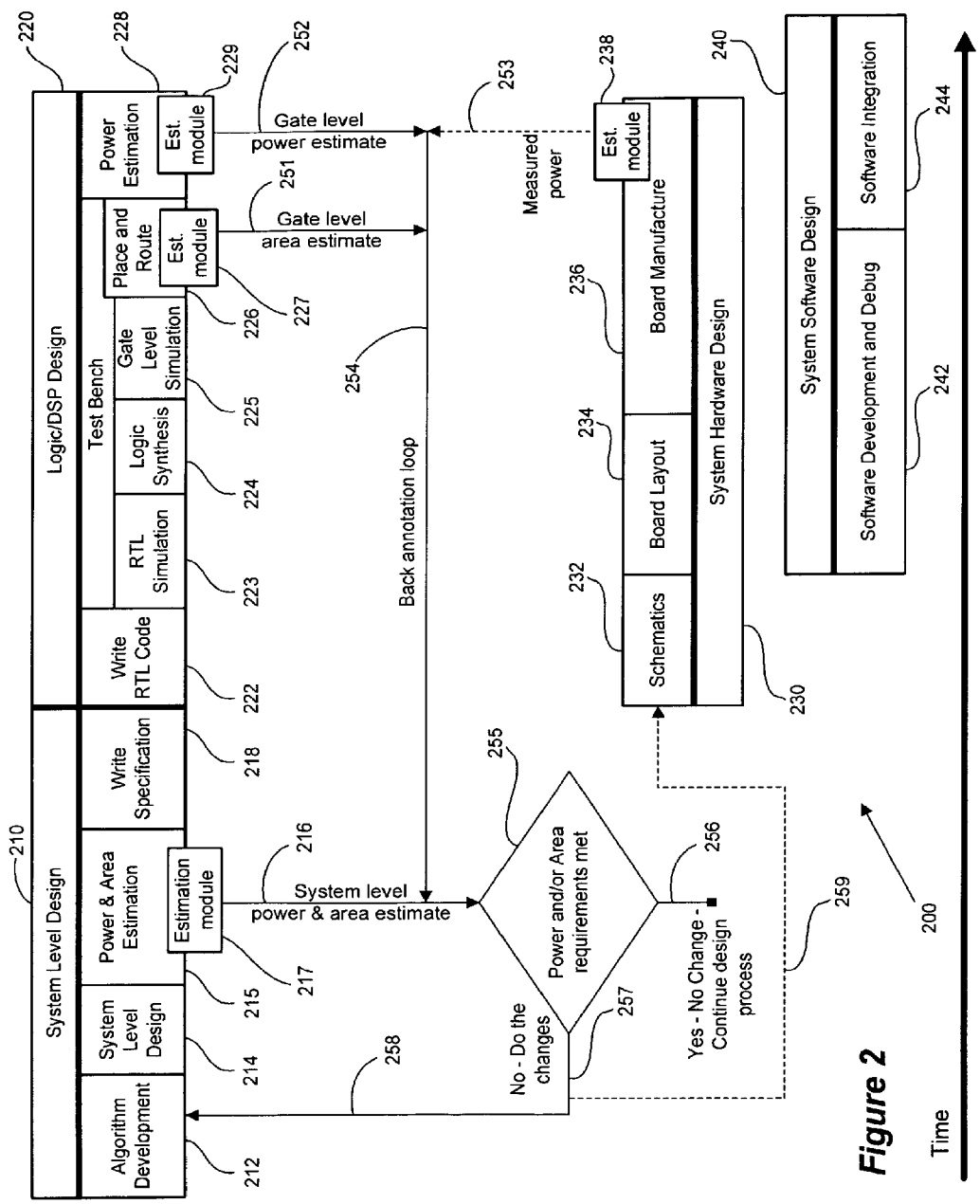
FIG. 2 is a flow and schematic diagram of a design process according to one embodiment of the techniques.

One embodiment of the systems and techniques is shown in FIG. 2. FIG. 2 provides a detailed view of the entire design process, including aspects of the systems and techniques. At least some of the steps performed in methods according to embodiments of the systems and techniques are computer-implemented, as will be appreciated by those skilled in the art.

The design process 200 is broken down into four domains or phases—the system level design phase 210, the logic/DSP design phase 220, the hardware design phase 230 and the software design phase 240. For ease of illustration and explanation, some steps and/or functions have been assigned to and/or associated with each of these phases. However, as will be appreciated by those skilled in the art, variations can be made to this design process configuration without departing from the spirit and scope of the systems and techniques.

In the system level design phase 210, one or more system level representations of a proposed electronic design are generated. The design process can start with the development of an algorithmic representation of the electronic design (one type of system level representation) being designed at 212. A designer may diagrammatically and/or mathematically depict a proposed design in any suitable fashion. This algorithmic representation is converted to a system level design (another type of system level representation) at step 214, which may contain references to hardware requirements and/ or structures and other particulars of the proposed design. At 215, power consumption is estimated on at least one of the system level representations of the proposed electronic design (which may be the algorithmic representation of the proposed design, the system level design or any other system level representation). As shown in FIG. 2, an area usage estimation also may be performed on the system level representation of the electronic design, if desired.

Figure 3:
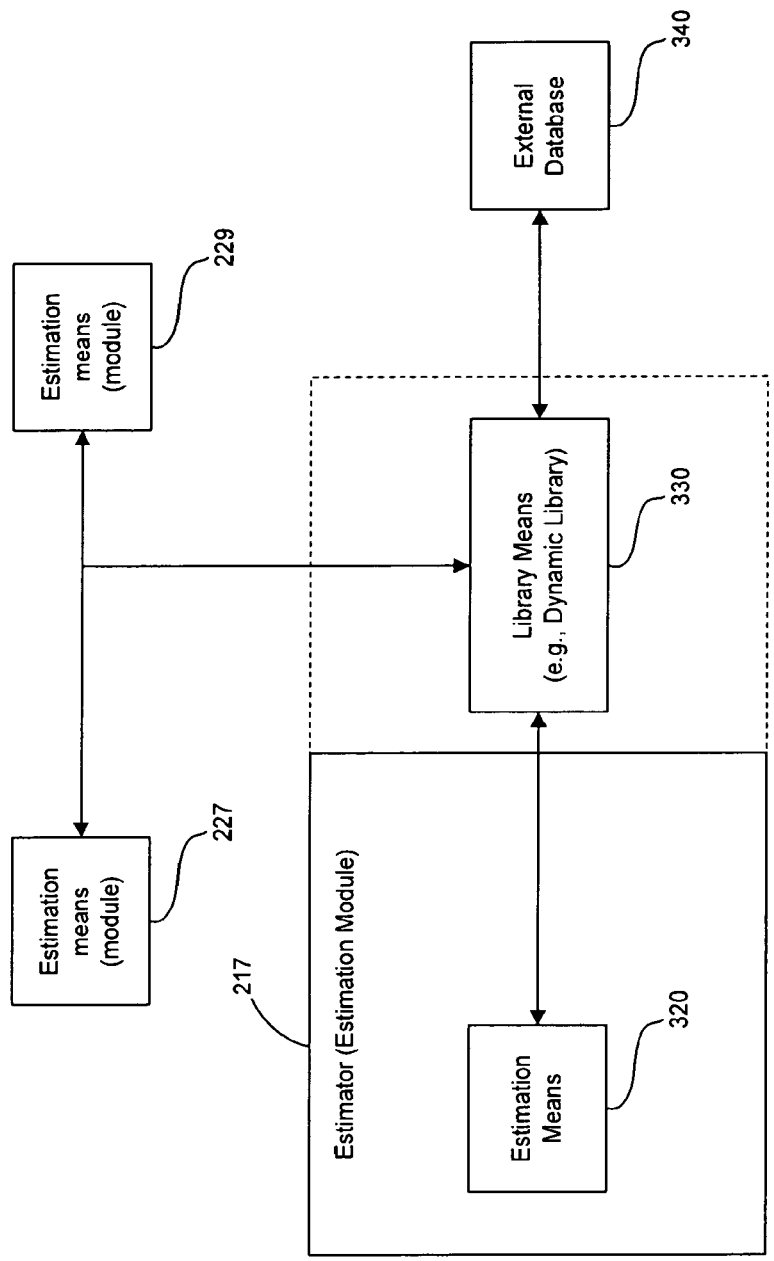
FIG. 3 is a block diagram of an estimation module that can be used in connection with embodiments of the systems and techniques.

The system level power consumption estimation(s) may be performed by estimators, estimation modules and/or programs in a computer. In FIG. 2 the power estimation is performed by an estimator/estimation module 217. This module may be a computer or other device running software that evaluates the system level representation of the proposed electronic design. As seen in FIG. 3, the estimator/estimation module 217 may be an estimator that includes estimation means 320. Estimation means 320 may consult library means 330, which may be a database or other library that is either contained in the estimator 217 or is external to it. The library means 330 may also consult an external database 340, if desired.

The library means 330 of the system level estimator/estimation module 217 (and possibly other estimators/estimation modules 227 and 229) can include library information to assist in performing the estimations. The library information may include power consumption information for a number of individual electronic design components and may also include power consumption information for combinations of electronic design components, taking into account the interactions of various components and the effect such interactions have on power consumption. For example, where a signal scalar and a filter are connected in series, the power consumption of the combined components may be different than the sum of the components' individual power consumption characteristics when not in such a combination.

This library information may include power consumption information for a number of electronic design components as well as power consumption information for various combinations of such electronic design components. The electronic design components can include pre-characterized blocks. The library information can be based on a wide variety of parameters such as: clock structure; dynamic I/O ranges; on-chip usage; off-chip usage; chip partitioning; input data characteristics; input stimuli; node toggling rates; and node port fan-out. Other parameters and considerations will be known to those skilled in the art and can be used as part of the power consumption and/or area usage estimations. Secondary information may also be considered, such as heating effects (both the ambient heat environment surrounding the proposed electronic design as well as the heat generated by the proposed electronic design, which may affect where and how a device utilizing the proposed design can be used), power sources (permitting use of smaller or larger power sources and the types of power needed) and the location of a device in which the proposed design will be implemented (for example, an automobile or other environment having some environmental conditions).

As denoted by the bi-directional flow of information between the estimators/estimation modules 217, 227, 229 in FIG. 3, the library may be an intelligent library that is adaptive, collecting and integrating past estimates and other information to enhance the scope, accuracy and adaptability of the library means 330. That is, the library may adjust its stored and available information based on data returned regarding components and combinations in general and with regard to the particular proposed electronic design under consideration. This allows the library to become more accurate and complete for future uses, especially within the design cycle of a particular proposed electronic design. DSP Builder from Altera already utilizes a library of system level tools and includes information regarding area and speed. That type of library could be upgraded to include and utilize the power consumption data developed by embodiments of the systems and techniques.

Estimator 217 generates a system level power consumption estimate at 216 and, if area usage is being evaluated, a system level area usage estimate as well. This estimate 216 is provided to a decision maker 255 and is compared to one or more power consumption and/or area usage requirements for the proposed design. If the requirements are met by the system level representation, then a specification may be written at 218, thus completing the system level design phase 210. At this point, responsibility for further development of the electronic design passes to a different individual or group of individuals.

When the system level power consumption estimate fails to meet a power consumption requirement, the system level representation is adjusted. For example, in FIG. 2, a system level designer can return via step 258 to the algorithm development step 212 to adjust the proposed electronic design to meet the requirement that was not met by the earlier version of the proposed electronic design. The design process 200 moves on to the logic/DSP phase 220 only after the system level power consumption estimate has met any desired or critical requirements.

The logic/DSP design phase 220 begins with the writing of code (for example, RTL code) representing the system level design at 222. This coded representation of the proposed electronic design is then tested via simulation at 223, synthesized at 224 and tested as a gate level representation via simulation at 225.

Altera's SignalCompiler can be used in connection with Simulink and MatLab for some or all of this process, as will be appreciated by those skilled in the art. SignalCompiler allows a designer to perform synthesis and place and route operations and to download a device configuration file directly to a development board from within Simulink, providing a seamless interface between implementation and verification. This process can significantly reduce the time needed to go from system design to evaluation and verification in actual hardware for rapid prototyping.

As part of or after performing the place and route operation at 226 in FIG. 2, area usage of the proposed electronic design can be estimated by module 227 to produce a gate level area usage estimate 251. Gate level power consumption may then be estimated using the gate level representation at 228. Again, this gate level power consumption estimate 252 may be generated by an estimation module 229 or the like. Modules 227, 229 may also consult library means 330 or an analogous library information source.

If more than one type of representation of the proposed electronic design is generated during this phase of the design process, then any suitable representation of the proposed electronic design can be used for these later stage area usage and power consumption estimates. The term "gate level representation" is intended to cover any such alternative representations available. Moreover, other later stage estimates may be made using the gate level representation, as will be appreciated by those skilled in the art.

Referring again to FIG. 2, one or both of the gate level estimates 251, 252 can be sent via a back annotation loop 254 to decision maker 255 to determine whether the proposed electronic design meets one or more power consumption and/or area usage constraints or requirements at 255. Again, this determination may be made by comparing an estimation to a power consumption maximum value or in any other suitable manner. If no changes are needed, then the proposed electronic design remains unchanged at 256. If a constraint or requirement is not met, then changes can be initiated at 257. One way in which such changes can be made is at the algorithm level at 258.

However, changes may be implemented at other points in the design process. For example, a hardware level representation may be generated using the hardware level phase 230, including schematic creation 232, board layout 234 and board manufacture 236. An estimator/estimation module 238, which may be similar in design and function to modules 217, 227, 229, can generate a hardware level power consumption estimate 253 that is compared to the power consumption requirements at 255. Adjustments based on this estimate 253 may be made at the system level 210 or may be made at the hardware level, for example, by step 259, returning to the hardware level design phase 230, as will be appreciated by those skilled in the art. In each comparison, the power consumption required may be the same one (for example, a maximum power consumption value).

Moreover, these estimates do not have to be used only for determining compliance with a constraint or requirement. Evaluation of these estimations also may be used to fine tune a proposed electronic design in other ways. The early stage estimate(s) at 216 can be viewed in some situations as coarse tuning of a proposed design, ensuring that future iterations and/or representations of the proposed design are reasonable and feasible with regard to the anticipated hardware implementation of the electronic design. Subsequent estimates, whether at the system level or gate level, can be used then for finer tuning of the proposed design.

Finally, different estimates may be combined to provide different types of feedback and information to a designer. For example, if power consumption, area usage and speed estimations are all performed, they may be combined (for example, by the decision maker 255) to generate a combined estimate representing a single performance value for the proposed design. Maximizing this value might represent finding the "sweet spot" for operational configurations. Various estimated information may be weighted to give preference to efficient or low power consumption or area usage. Likewise, estimation information can be considered as a multiple value vector, defining operational regions and/or sets of parameters for the proposed electronic design. Finally, the estimation information can be used to evaluate trade offs between various performance characteristics of the proposed design. For example, power consumption and area usage estimates may be used to evaluate the trade off between these characteristics, allowing a designer to decide whether a reduction in area usage is worth higher power consumption, etc.

Current system level tools such as DSP Builder and Simulink typically assist users in assembling pre-characterized blocks that are system level functions. The block complexity varies from simple (for example, a simple register function) to more complex functions (such as filter or error correction blocks). Some hardware implementation information is available for these types of blocks. For example, Altera's FIR Compiler provides dynamic device area information in the system level domain, and the system level designer is able to evaluate the device size required for the algorithm when using such a block.

As is known to those skilled in the art, power estimation of a proposed design is based on one or more complex equations which involve device area, toggling rate (as well as device timing information) and physical printed circuit board parameters (for example, package temperature). The equations' complexity grows with the accuracy of a requested estimation. Power estimation based on area and toggling rate is less accurate when device timing information is ignored, but this enables a shorter design analysis cycle within the system level domain, and may be enough to assist with algorithm decisions early in the design cycle. For more accurate computations, back annotation of data from the hardware domain (noted above in connection with FIG. 2) can be used along with power estimations and other data from the power estimation performed at the end of the logic/DSP phase of the design process.

Generally, one method of generating power estimates in the system level domain (which will not be as accurate as the power estimation computation from the hardware domain) can include:

Providing a library of pre-characterized blocks with area, toggling rate and other useful information; and Updating the system level parser (for example, Signal-Compiler) with a power consumption computation function that gets enabled during system level simulation. At the end of a system level simulation, each DSP Builder block can output an area and toggling rate variable which gets read by the power consumption computation function.

Back annotation, providing power information from the hardware domain into the system level domain, can be useful in some embodiments of the systems and techniques (for example, to help identify which algorithm subsystems are power critical). For example, using a combination of Altera's Quartus II power information with LogiLock flow, a DSP Builder design consisting of multiple sub-systems, can be fed into a flow where each sub-system gets compiled individually in Quartus II. Then, the automated script back annotates power consumption values for each subsystem into the Simulink domain.

Embodiments of the systems and techniques can be particularly useful in applications that are power consumption sensitive, such as automotive, embedded consumer applications, medical applications, military applications, communications and multichannel configurations and systems.

Figure 4:
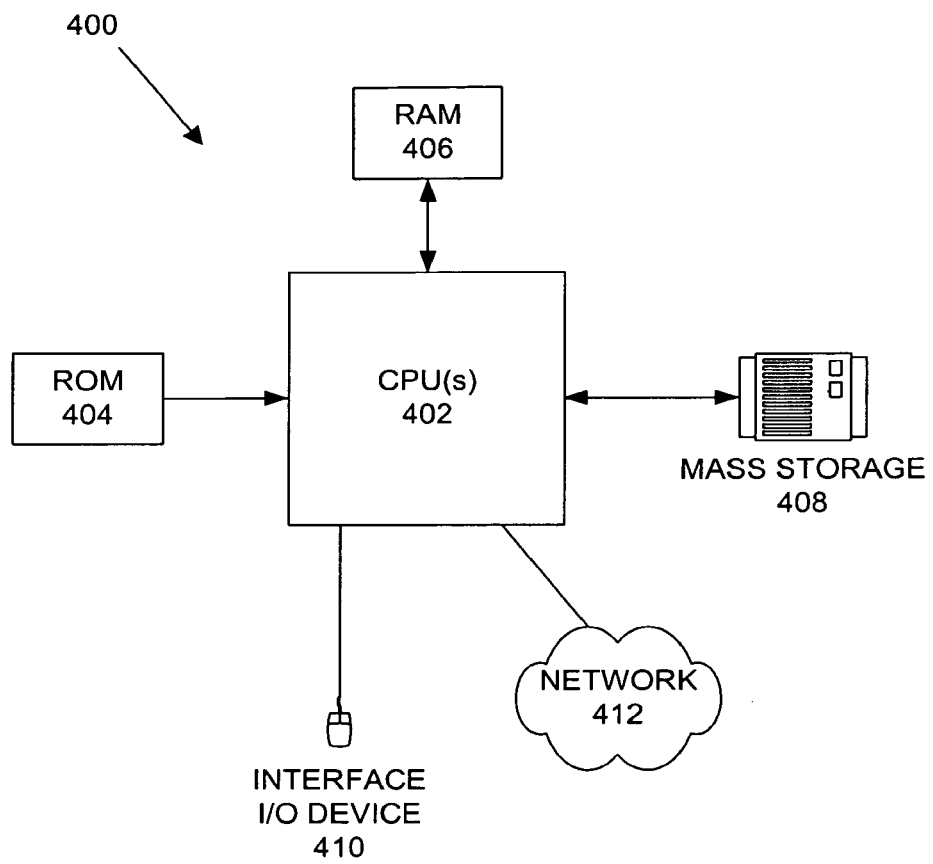
FIG. 4 is a block diagram of a typical computer system suitable for implementing an embodiment of the systems and techniques.

FIG. 4 illustrates a typical computer system that can be used by a designer and/or other user in accordance with one or more embodiments of the systems and techniques. The computer system 400 includes one or more processors 402 (also referred to as central processing units, or CPUs) that are coupled to storage devices including primary storage 406 (typically a random access memory, or RAM) and another primary storage 404 (typically a read only memory, or ROM). As is well known in the art, primary storage 404 acts to transfer data and instructions uni-directionally to the CPU and primary storage 406 is used typically to transfer data and instructions in a bi-directional manner. Both of these primary storage devices may include any suitable computer-readable media described above, including a computer program product comprising a machine readable medium on which is provided program instructions according to one or more embodiments of the systems and techniques. A mass storage device 408 also is coupled bi-directionally to CPU 402 and provides additional data storage capacity and may include any of the computer-readable media described above, including a computer program product comprising a machine readable medium on which is provided program instructions according to one or more embodiments of the systems and techniques. The mass storage device 408 may be used to store programs, data and the like and is typically a secondary storage medium such as a hard disk that is slower than primary storage. It will be appreciated that the information retained within the mass storage device 408, may, in appropriate cases, be incorporated in standard fashion as part of primary storage 406 as virtual memory. A mass storage device such as a CD-ROM may also pass data uni-directionally to the CPU.

CPU 402 also is coupled to an interface 410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 402 optionally may be coupled to a computer or telecommunications network using a network connection as shown generally at 412. With such a network connection, it is contemplated that the CPU might receive information from the network, or might output information to the network in the course of performing the above-described method steps. The above-described devices and materials will be familiar to those of skill in the computer hardware and software arts.

Figure 5:
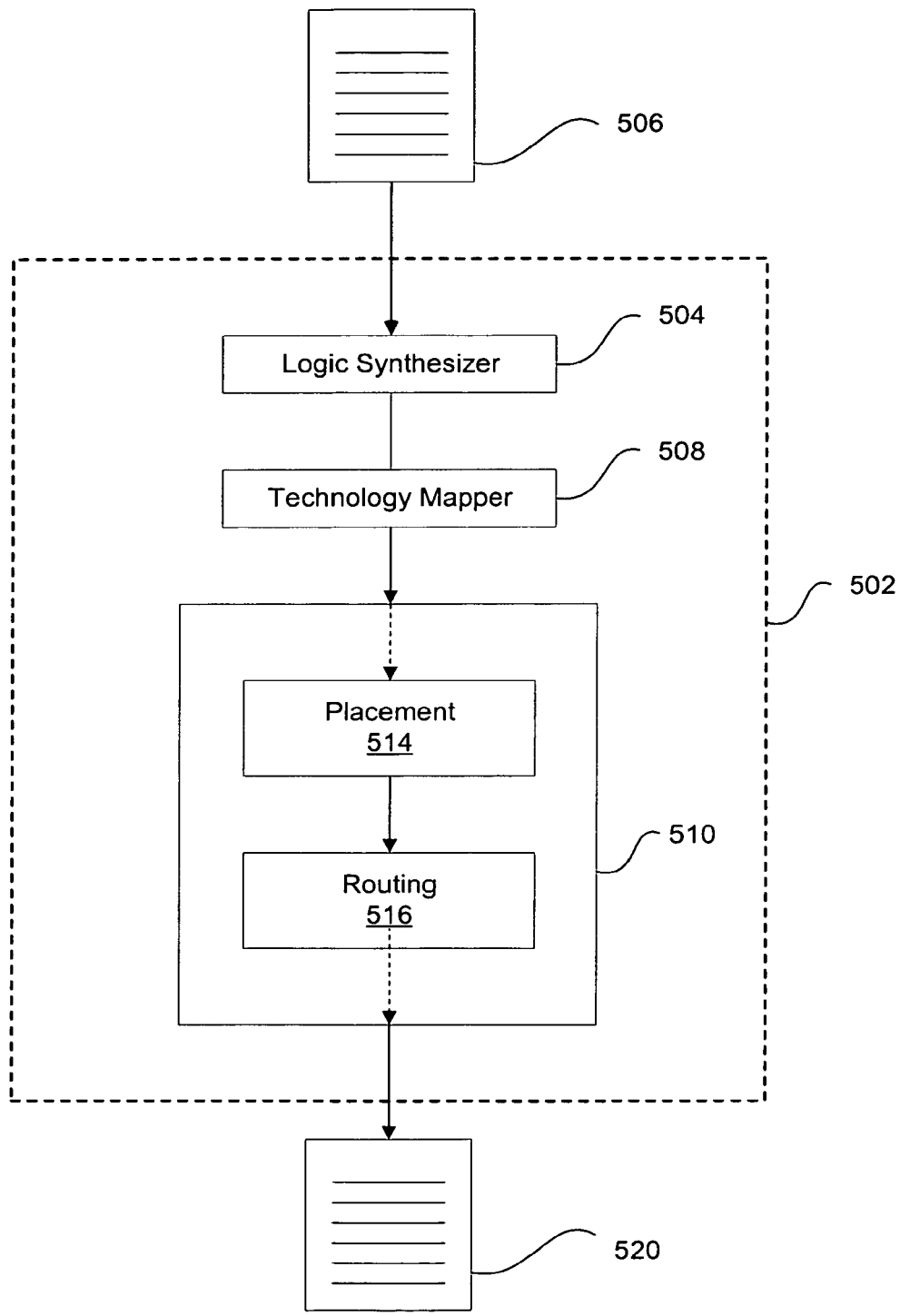
FIG. 5 is a block diagram showing logic/DSP modules that may be employed in a PLD design compiler usable with embodiments of the systems and techniques.

The hardware elements described above may define multiple software modules for performing one or more steps and/or operations according to embodiments of the systems and techniques. For example, instructions for running a power consumption estimation program, a design tool or any other appropriate program may be stored on mass storage device 408 or 404 and executed on CPU 402 in conjunction with primary memory 406. In synthesizing a design from a simulation version, a user may use a compiler to generate the design for implementation on hardware. Referring to FIG. 5, a compiler 502 includes a logic synthesizer 504 which creates a synthesized netlist from a user's high level electronic design 506. Compiler 502 also includes a technology mapper 508 which maps gates from the synthesized netlist into logic cells. Finally, compiler 502 includes a place and route module 510 which in turn includes a placement module 514 and a routing module 516. Placement module 514 places logic cells onto logic elements of a target hardware device. Routing module 516 connects wires between the inputs and outputs of the various logic elements in accordance with the logic required to implement the electronic design.

Compiler 502 outputs a compiled design 520. It should be understood that other compiler designs may be employed with this invention. For example, some compilers will include a partitioning module to partition a technology mapped design onto multiple hardware entities. In addition, the compiler may be adapted to handle hierarchical designs, whereby synthesis, mapping, etc. are performed recursively as the compiler moves down branches of a hierarchy tree. Additional details of compiler software for PLDs may be found in U.S. Pat. No. 6,080,204, issued Jun. 27, 2000, naming Mendel as inventor, entitled "METHOD AND APPARATUS FOR CONTEMPORANEOUSLY COMPILING AN ELECTRONIC CIRCUIT DESIGN BY CONTEMPORANEOUSLY BIPARTITIONING THE ELECTRONIC CIRCUIT DESIGN USING PARALLEL PROCESSING."

The many features and advantages of the systems and techniques are apparent from the written description, and thus, the appended claims are intended to cover all such features and advantages of the invention. Further, since numerous modifications and changes will readily occur to those skilled in the art, the systems and techniques is not limited to the exact construction and operation illustrated and described. Therefore, the described embodiments are illustrative and not restrictive, and the invention should not be limited to the details given herein but should be defined by the following claims and their full scope of equivalents, whether foreseeable or unforeseeable now or in the future.

The invention claimed is:

1. A method comprising:
receiving or generating at a computer, during a system level design phase, a first system level representation of an electronic design implementable in an electronic circuit, the system level design phase preceding and excluding (i) development of an RTL representation of the electronic circuit and (ii) generation of any gate level or hardware level representations of the electronic design, and during the system level design phase:
estimating power consumption of the electronic circuit implemented using the first system level representation, to produce a first system level power consumption estimate;
adjusting the first system level representation to generate, with the computer, an adjusted system level representation when the first system level power consumption estimate fails to meet one or more power consumption requirements; and
estimating power consumption of the electronic circuit implemented using the adjusted system level representation.

2. The method of claim 1 wherein the first system level representation is an algorithmic representation of the electronic design.

3. The method of claim 1 wherein the first system level power estimate comprises one of (a) an estimate of the power consumption of the entire electronic design, (b) an estimate of the power consumption of individual components and/or combinations of the individual components of the electronic design, or (c) a combination of (a) and (b).

4. The method of claim 1 wherein estimating power consumption of the system level representation comprises consulting library information, said library information comprising power consumption information for a plurality of electronic design components; and/or power consumption information for combinations of electronic design components.

5. The method of claim 3 further comprising:
generating a gate level representation of the electronic design based on the first system level representation;
estimating power consumption of the gate level representation to produce a first gate level power consumption estimate; and
when the first gate level power consumption estimate fails to meet one or more gate level power consumption requirements, adjusting at least one of the following:
the system level representation; or
the gate level representation.

6. The method of claim 5 wherein estimating power consumption of the system level representation comprises consulting library information and further wherein estimating power consumption of the gate level representation comprises consulting library information.

7. The method of claim 5 wherein adjusting the system level representation or the gate level representation comprises generating a combined power consumption estimate based on evaluating both the first gate level power consumption estimate and the first system level power consumption estimate.

8. The method of claim 5 further comprising:
estimating area usage of the gate level representation to produce a gate level area usage estimate; and
when the gate level area usage estimate fails to meet one or more gate level area usage requirements adjusting at least one of the following:
the system level representation; or
the gate level representation.

9. The method of claim 5 further comprising:
estimating area usage or estimating system speed for an electrical circuit designed using the gate level representation or the hardware level representation of the electronic design;
when the area usage estimate or the system speed estimate fails to meet one or more of speed or cost requirements, respectively, adjusting at least one of the following:
the system level representation;
the gate level representation; or
the hardware level representation.

10. The method of claim 9 wherein the area usage estimate, the system speed estimate, and the first gate level power consumption estimate, are evaluated to produce a combined estimation for the electronic design, the combined estimation used in adjusting the system level representation, the gate level representation, or the hardware level representation.

11. The method of claim 10 wherein the combined estimation represents a single performance value for the electronic design based on weighting values for the area usage estimate, the system speed estimate, and the first gate level power consumption estimate, differently depending on a user's indicated preferences.

12. The method of claim 10 wherein values for the area usage estimate, the system speed estimate, and the first gate level power consumption estimate, are presented as a multiple value vector, the multiple value vector presenting desirable operational ranges or sets of parameters for the electronic design.

13. The method of claim 10 wherein the combined estimation is used to evaluate trade-offs between two or more of the following in the electronic design or a portion of the electronic design: area usage, system speed, and power consumption.

14. The method of claim 5 further comprising:
generating a second gate level representation of the electronic design based on the first system level representation;
estimating power consumption of the second gate level representation to produce a second gate level power consumption estimate; and
when the second gate level power consumption estimate fails to meet one or more gate level power consumption requirements, adjusting at least one of the following:
the system level representation; or
the gate level representation.

15. The method of claim 14 wherein adjusting the system level representation, the gate level representation, or the hardware level representation, comprises generating a combined power consumption estimate based on evaluating two or more of the first hardware level power consumption measurement, the first gate level power consumption estimate, the second gate level power consumption estimate, and the first system level power consumption estimate.

16. The method of claim 3 further comprising:
generating a hardware level representation of the electronic design;
measuring power consumption of the hardware level representation to produce a first hardware level power consumption measurement;
when the first hardware level power consumption measurement fails to meet one or more hardware level power consumption requirements, adjusting at least one of the following:
the system level representation;
the gate level representation; or
the hardware level representation.

17. The method of claim 16 wherein adjusting the system level representation, the gate level representation, or the hardware level representation, comprises generating a combined power consumption estimate based on evaluating two or more of the first hardware level power consumption measurement, the first gate level power consumption estimate, and the first system level power consumption estimate.

18. The method of claim 4 wherein said library information is stored in an adaptive library, the adaptive library configured to collect and analyze data regarding past power consumption estimates to adjust its stored information regarding power consumption for electronic design components, combinations of electronic design components, and/or electronic designs.

19. The method of claim 1 wherein the library information is based on at least one of the following:
clock structure;
dynamic I/O ranges;
on-chip usage;
off-chip usage;
chip partitioning;
input data characteristics;
input stimuli;
node toggling rates;
node port fan-out;
heating effects;
power sources; and
location of a device in which the electronic design is to be implemented.

20. A computer program product comprising a non-transitory machine readable medium on which is provided program instructions for execution by a computer, to perform a method comprising:
receiving or generating at the computer, during a system level design phase, a first system level representation of an electronic design implementable in an electronic circuit, the system level design phase preceding and excluding (i) development of an RTL representation of the electronic circuit and (ii) generation of any gate level or hardware level representations of the electronic design, and during the system level design phase:
estimating power consumption of the electronic circuit implemented using the first system level representation, to produce a first system level power consumption estimate;
adjusting the first system level representation to generate an adjusted system level representation when the first system level power consumption estimate fails to meet one or more power consumption requirements and
estimating power consumption of the electronic circuit implemented using the adjusted system level representation.

\* \* \* \* \*